United States Patent
Cheng et al.

(10) Patent No.: US 9,716,170 B1
(45) Date of Patent: Jul. 25, 2017

(54) REDUCED CAPACITANCE IN VERTICAL TRANSISTORS BY PREVENTING EXCESSIVE OVERLAP BETWEEN THE GATE AND THE SOURCE/DRAIN

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/282,398

(22) Filed: Sep. 30, 2016

(51) Int. Cl.
*H01L 29/78* (2006.01)
*H01L 29/66* (2006.01)
*H01L 29/417* (2006.01)

(52) U.S. Cl.
CPC .... *H01L 29/7827* (2013.01); *H01L 29/41741* (2013.01); *H01L 29/66666* (2013.01)

(58) Field of Classification Search
CPC ........... H01L 29/7827; H01L 29/66666; H01L 29/41741
See application file for complete search history.

(56) References Cited

U.S. PATENT DOCUMENTS

| | | | |
|---|---|---|---|
| 5,087,581 A | 2/1992 | Rodder | |
| 7,683,428 B2 | 3/2010 | Chidambarrao et al. | |
| 8,637,849 B2 | 1/2014 | Deligianni et al. | |
| 9,299,835 B1 | 3/2016 | Anderson et al. | |
| 9,368,572 B1 | 6/2016 | Cheng et al. | |
| 2005/0067630 A1* | 3/2005 | Zhao | H01L 29/8083 257/134 |
| 2013/0187220 A1* | 7/2013 | Surthi | H01L 21/764 257/329 |

OTHER PUBLICATIONS

Anderson, et al., "Vertical FET Structure," U.S. Appl. No. 15/139,937, filed Apr. 27, 2016.
(Continued)

*Primary Examiner* — Thanh V Pham
(74) *Attorney, Agent, or Firm* — Cantor Colburn LLP; David Quinn

(57) ABSTRACT

Embodiments of the invention are directed to a vertical FET device having gate and source or drain features. The device includes a fin formed in a substrate and a source or a drain region formed in the substrate. The device further includes a trench formed in the source or the drain region and a dielectric region formed in the trench. The device further includes a gate formed along vertical sidewalls of the fin and positioned such that a space between the gate and the source or the drain region includes at least a portion of the dielectric region. In some embodiments, the device further includes a bottom spacer formed over an upper surface of the dielectric region and positioned such that the space between the gate and the source or the drain region further includes at least a portion of the bottom spacer.

11 Claims, 11 Drawing Sheets

(56) References Cited

OTHER PUBLICATIONS

Cheng, et al., "Fabrication of Vertical Field Effect Transistor Structure With Controlled Gate Length," U.S. Appl. No. 15/087,074, filed Mar. 31, 2016.
Kunz et al., "Reduction of Parasitic Capacitance in Vertical MOSFETs by Spacer Local Oxidation," IEEE Transactions on Electron Devices, vol. 50, No. 6, Jun. 2003, pp. 1487-1493, IEEE.
Mallela, et al., "Vertical Field Effect Transistors With Metallic Source/Drain Regions," U.S. Appl. No. 15/140,763, filed Apr. 28, 2016.
Mallela, et al., "Vertical Field Effect Transistors With Protective Fin Liner During Bottom Spacer Recess Etch," U.S. Appl. No. 15/009,179, filed Jan. 28, 2016.
Cheng et al., "Reduced Capacitance in Vertical Transistors by Preventing Excessive Overlap Between the Gate and the Source/Drain," U.S. Appl. No. 15/433,309, filed Feb. 15, 2017.
List of IBM Patents or Patent Applications Treated as Related; Date Filed: Sep. 30, 2016, 2 pages.

\* cited by examiner

REDUCED CAPACITANCE IN VERTICAL TRANSISTORS BY PREVENTING EXCESSIVE OVERLAP BETWEEN THE GATE AND THE SOURCE/DRAIN

BACKGROUND

The present invention relates in general to fabrication methods and resulting structures for transistors formed in integrated circuits (ICs). More specifically, the present invention relates to improved systems, fabrication methods and resulting structures for vertical field effect transistors (FET) that reduce unwanted capacitance caused by excessive overlap between the gate region and the source/drain regions.

Semiconductor devices are typically formed in active regions of a wafer. In an IC having a plurality of metal oxide semiconductor field effect transistors (MOSFETs), each MOSFET has a source and a drain that are formed in the active region of the semiconductor wafer or substrate by implanting n-type or p-type impurities therein. A MOSFET can be considered a planar device because its channel extends laterally with respect to the major surface of the device substrate. Thus, current flows laterally through the planar MOSFET channel. One type of non-planar MOSFET is known generally as a vertical FET. In order to decrease gate pitch (i.e., the center-to-center distance between adjacent gate structures) and increase device density on the wafer, the channel region of a vertical FET is substantially perpendicular with respect to the major surface of the device substrate. Thus, current flows vertically through the non-planar vertical FET channel.

SUMMARY

Embodiments of the present invention are directed to a method of forming gate and source or drain features of a vertical FET. The method includes forming a fin on a substrate and forming a source or a drain region in an upper region of the substrate. The method further includes forming a dielectric region over an upper surface of the source or the drain region. The method further includes forming a gate along vertical sidewalls of the fin such that a space between the gate and the source or the drain region includes at least a portion of the dielectric region.

Embodiments of the present invention are further directed to a method of forming gate and source or drain features of a vertical FET. The method includes forming a fin in a substrate and forming a source or a drain region in the substrate. The method further includes forming a trench in the source or the drain region and forming a dielectric region in the trench. The method further includes forming a gate along vertical sidewalls of the fin such that a space between the gate and the source or the drain region includes at least a portion of the dielectric region. The method further includes forming a bottom spacer over an upper surface of the dielectric region such that the space between the gate and the source or the drain region further includes at least a portion of the bottom spacer.

Embodiments of the present invention are further directed to a vertical FET device having gate and source or drain features. The device includes a fin formed in a substrate and a source or a drain region formed in the substrate. The device further includes a trench formed in the source or the drain region and a dielectric region formed in the trench. The device further includes a gate formed along vertical sidewalls of the fin and positioned such that a space between the gate and the source or the drain region includes at least a portion of the dielectric region. In some embodiments, the device further includes a bottom spacer formed over an upper surface of the dielectric region and positioned such that the space between the gate and the source or the drain region further includes at least a portion of the bottom spacer.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

Figure 1:
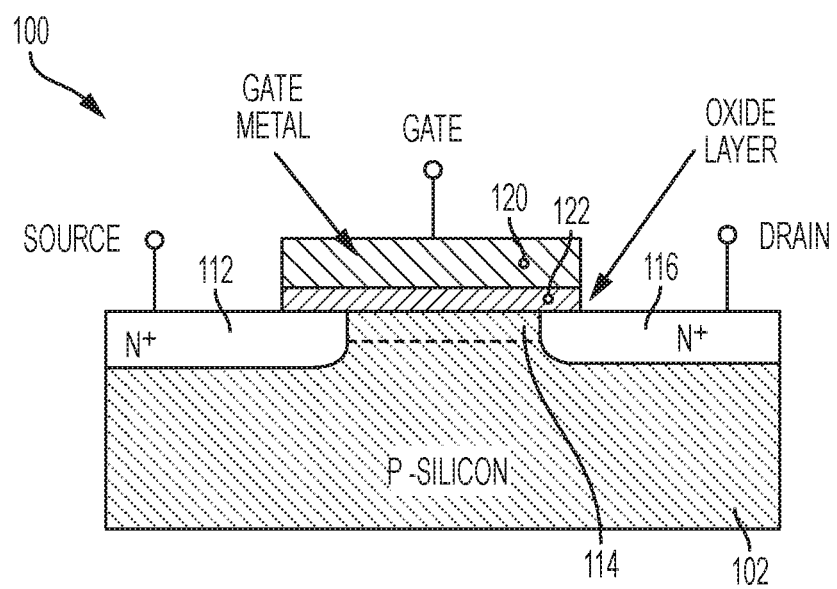
FIG. 1 depicts cross-sectional view of a know configuration of planar MOSFET.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of vertical FET, implementation of the teachings recited herein are not limited to a particular type of vertical FET or IC architecture. Rather embodiments of the present invention are capable of being implemented in conjunction with any other type of vertical FET or IC architecture, now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

Semiconductor devices are used in a variety of electronic and electro-optical applications. ICs are typically formed from various circuit configurations of discrete components (e.g., transistors, capacitors, resistors, semiconductor devices, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the following paragraphs.

The semiconductor device structures of the present invention can be fabricated in a number of ways using a number of different tools. In general, though, the methodologies and tools are used to form structures with dimensions in the micrometer and nanometer scale. The methodologies, i.e., technologies, employed to fabricate the semiconductor device structures of the present invention have been adopted from IC technology. For example, semiconductor device structures are built on wafers and are realized in films of material patterned by photolithographic processes on the top of a wafer. In particular, the fabrication of semiconductor device structures uses four basic building blocks: (i) deposition of thin films of material on a substrate, (ii) applying a patterned mask on top of the films by photolithographic imaging, (iii) semiconductor doping, and/or (iv) etching the films selectively to the mask.

In general, deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to embodiments of the present invention, semiconductor devices are typically formed using active regions of a wafer. The active regions are defined by isolation regions used to separate and electrically isolate adjacent semiconductor devices. An example of a metal oxide semiconductor field effect transistor (MOSFET) 100, which can be formed in the active region of an IC, is shown in FIG. 1. MOSFET 100 includes a source 112 and a drain 116 that are formed in an active region of a semiconductor layer by implanting n-type or p-type impurities in the layer of semiconductor material. Disposed between the source and the drain is a channel region 114, which is formed above a body region or a substrate 102. Disposed above the channel region 114 is a gate electrode 120, which is spaced apart from the channel region 114 by a gate dielectric layer 122.

As shown in FIG. 1, there is overlap between the gate 120 and the source 112, as well as between the gate 120 and the drain 116. The gate/source/drain overlaps ensure there is a continuous channel 114. Some unwanted capacitive coupling is present between the gate 120 and the source 112, as well as between the gate 120 and the drain 116. Unwanted capacitive coupling between the gate 120 and either the source 112 or the drain 116 can slow the switching speed of the MOSFET 100. However, unwanted capacitive coupling can be mitigated in MOSFET designs by keeping the gate/source/drain overlaps within a range, which is typically approximately 3-4 nanometers (nm).

Alternative MOSFET device structures have been proposed to improve device performance, particularly at the interface between the gate and the channel. One type of MOSFET is a non-planar device known generally as a fin-type field effect transistor (FinFET). The basic electrical layout and mode of operation of a FinFET device does not differ significantly from a traditional field effect transistor (FET). In contrast to a planar MOSFET, however, the source, drain and channel regions of a FinFET are built as a three-dimensional fin/bar on top of a local shallow trench isolation (STI) region and a semiconductor substrate. The gate electrode is wrapped over the top and sides of a middle portion of the fin such that the grate electrode is substantially perpendicular with respect to the fin. This middle portion of the fin, which is under the gate electrode, functions as the channel and provides an increased effective channel width compared to planar MOSFETs. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

As non-planar MOSFETs are scaled to smaller dimensions/geometries for higher device density, so-called vertical FETs have been developed. Unlike FinFET structures, the entire fin of a nanowire vertical FET functions as the channel region. The gate, which is parallel to the vertical sidewalls of the fin, wraps around the fin sidewalls. Source/drain regions are formed above and below the fin channel. In order to decrease gate pitch (i.e., the center-to-center distance between adjacent gate structures) and increase device density of a typical vertical FET, it is desirable to form the fin/channel region and the surrounding gate region with relatively high aspect ratios. In other words, it is desirable for the fin/channel region and the gate region to each be much taller than wide.

A MOSFET can be considered a planar device because its channel extends laterally with respect to the major surface of the device substrate. Thus, current flows laterally through the planar MOSFET channel. In a vertical FET, where the channel region is substantially perpendicular with respect to the major surface of the device substrate, current flows vertically through the non-planar vertical FET channel.

Although vertical FETs reduce the transistor footprint and provide some improved performance characteristics over other MOSFET configurations, some performance aspects of known vertical FETs configurations are not optimized. For example, because the gate wraps extends along the fin channel sidewall and wraps around the fin, in know vertical FET configurations, the gate structure can be positioned almost entirely over the source/drain regions, separated only by a relatively thin bottom spacer formed from a high-k dielectric material. Accordingly, known vertical FET designs include an excessive amount of gate/source/drain overlap, which causes a large amount of capacitive coupling between the gate and the source/drain. As previously noted herein, unwanted capacitive coupling between the gate and the source or the drain (or both) can slow the switching speed of the transistor. If the unwanted capacitive coupling is large enough, the transistor switching speed can exceed an acceptable range.

Turning now to an overview of aspects of the present invention, embodiments of the present invention provide improved fabrication methodologies and resulting structures for vertical FETs that reduce the impact of unwanted capacitance due to gate/source/drain overlap. In one or more embodiments, a portion of the bottom source/drain region that is below the vertical FET gate is replaced with a dielectric region. Thus, the dielectric region is positioned between the vertical gate and the bottom source/drain region, thereby increasing the distance between the vertical gate and the bottom source/drain region and reducing the capacitive coupling between the vertical FET gate and the bottom source/drain region. The vertical height dimension of the dielectric region is selected to bring any capacitive coupling between the vertical FET gate and the source/drain to within an acceptable range for the particular vertical FET design.

Figure 2:
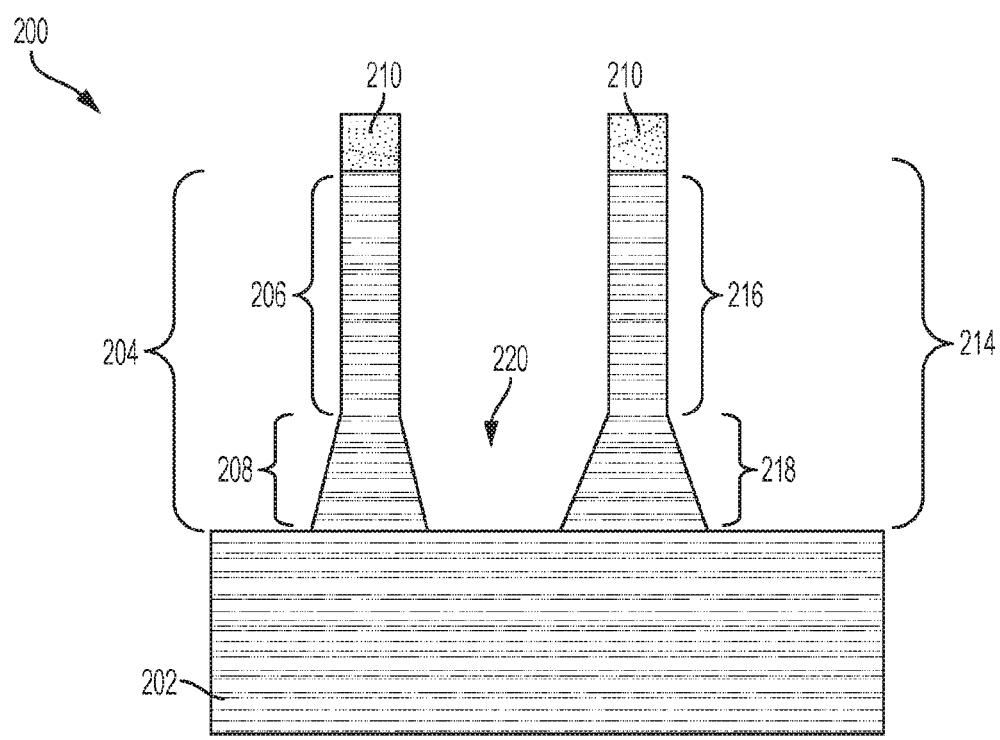
FIG. 2 depicts a diagram of semiconductor structure after initial fabrication stages according to one or more embodiments.

Turning now to a more detailed description of the aspects of the present invention, FIG. 2 depicts a semiconductor structure 200 after initial fabrication stages according to one or more embodiments. In one or more embodiments, the structure 200 will be, after completion of the fabrication process, adjacent vertical FET structures having reduced unwanted capacitance due to gate/source/drain overlap according to embodiments of the present invention. As shown in FIG. 2, a hard mask layer (not shown) is formed over a substrate 202. The hard mask layer is patterned, and then hard masks (HM) 210 and silicon fins 204, 214 are formed by any suitable fin formation process (e.g., applying an anisotropic etch process). Because there is no stop layer on substrate 202, the etch process is time based. Hard masks 210 can be a silicon nitride material (e.g., Si3Ni4).

Figure 8:
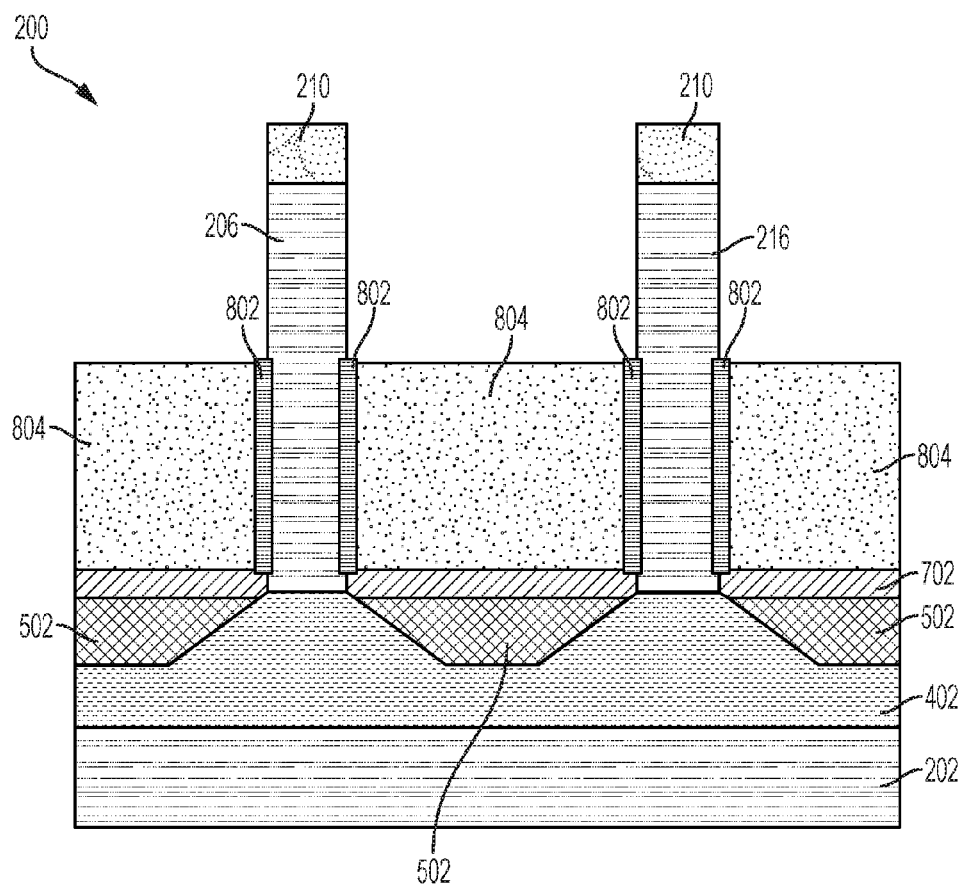
FIG. 8 depicts a diagram of semiconductor structure after intermediate fabrication stages according to one or more embodiments.
Figure 9:
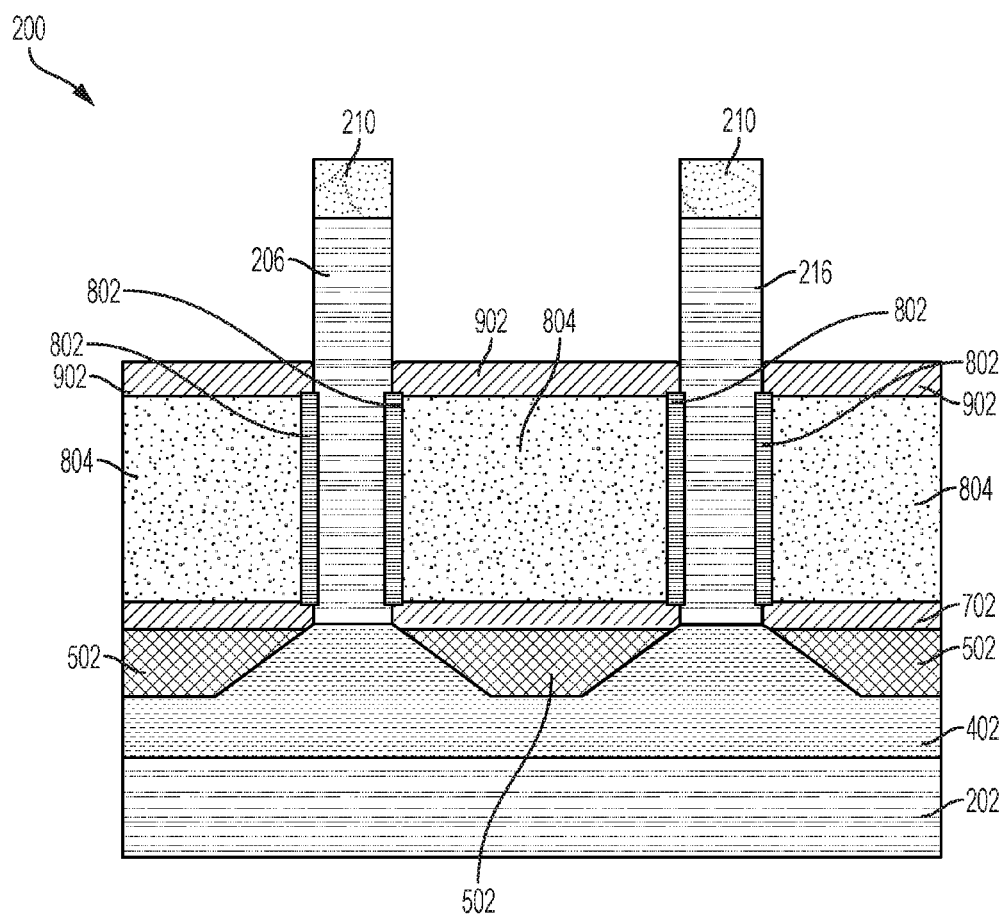
FIG. 9 depicts a diagram of semiconductor structure after intermediate fabrication stages according to one or more embodiments.
Figure 10:
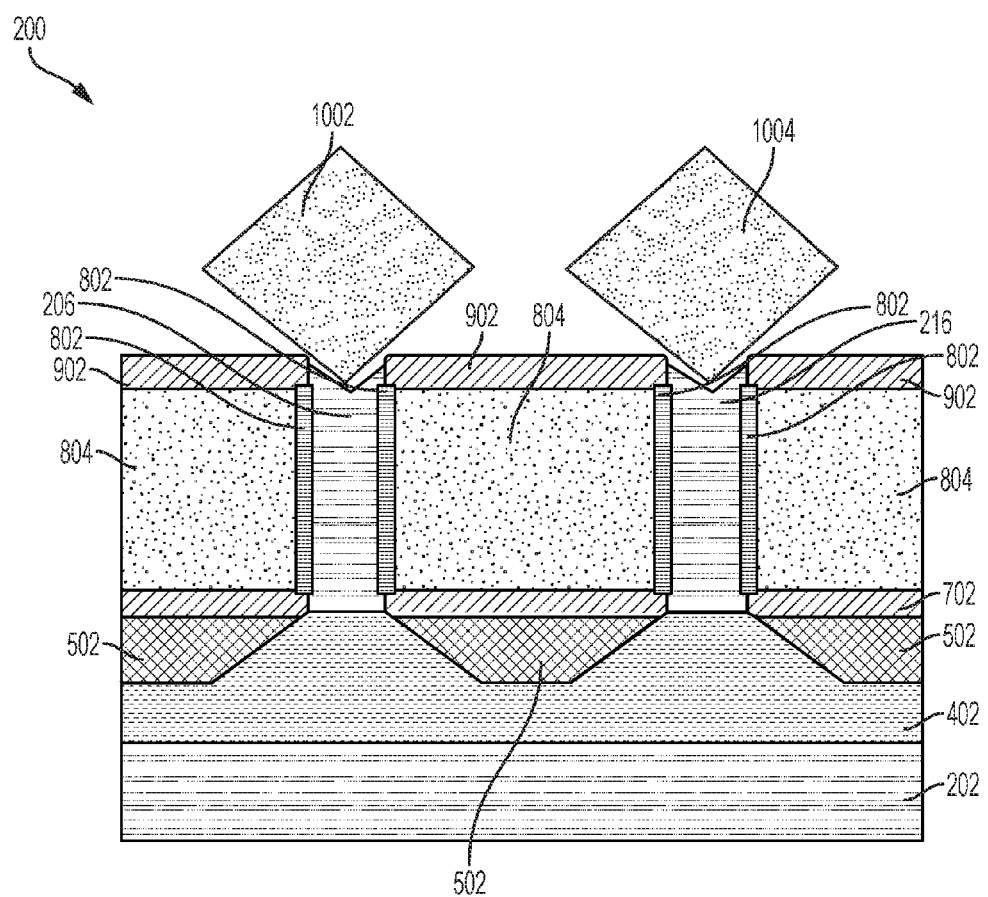
FIG. 10 depicts a diagram of semiconductor structure after final fabrication stages according to one or more embodiments.

In the embodiment shown in FIG. 2, fins 204, 214 are etched in a manner that forms upper fin regions 206, 216 and lower base regions 208, 218. To form the upper fin regions 206, 216, the etch is configured to initially etch the fins 204, 214 in a direction that is substantially perpendicular with respect to the major surface of the substrate, which results in the sidewalls of the upper fin regions 206, 216 being substantially perpendicular with respect to the major surface of the substrate. After the upper fin regions 206, 216 are formed, the etch configuration is switched and applied to the structure 200 in order to etch the fins 204, 214 in a direction that is substantially angled (i.e., non-perpendicular and non-planar) with respect to the major surface of the substrate, which results in the formation of the lower base regions 208, 218 having sidewalls that are substantially angled (i.e., non-perpendicular and non-planar) with respect to the major surface of the substrate. The sidewall of the lower base regions 208, 218 are also referred to herein as upper surfaces of the lower base regions 208, 218. Each of the lower base regions 208, 218 forms a portion of trenches 220, which, in effect surround the fins 204, 214 in substantially the same manner as the vertical FET gate 804, which is shown in FIGS. 8-10 and described in greater detail later in this description.

Figure 3:
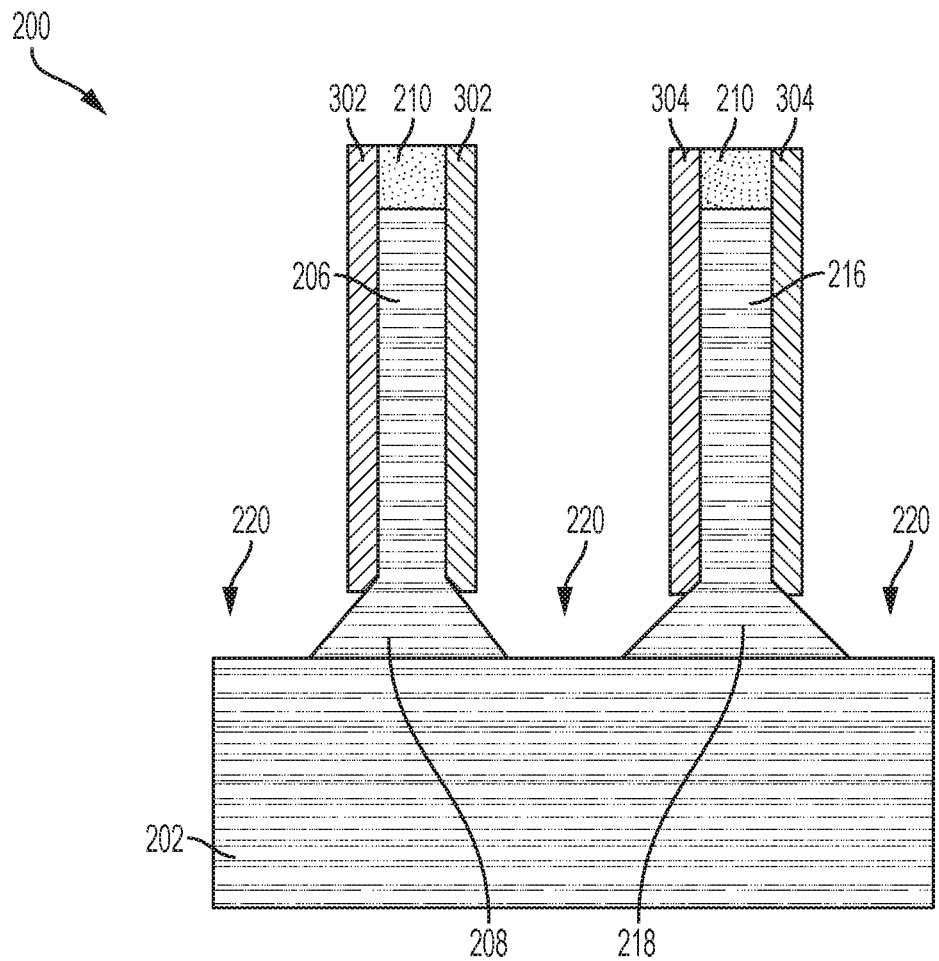
FIG. 3 depicts a diagram of semiconductor structure after intermediate fabrication stages according to one or more embodiments.

In FIG. 3, sacrificial vertical spacers 302, 304 are formed along and around the sidewalls of the upper fin regions 206, 216. Spacers 302, 304 can be formed using a spacer pull down formation process. Spacers 302, 304 can also be formed using a sidewall image transfer (SIT) spacer formation process, which includes spacer material deposition followed by directional RIE of the deposited spacer material.

Figure 4:
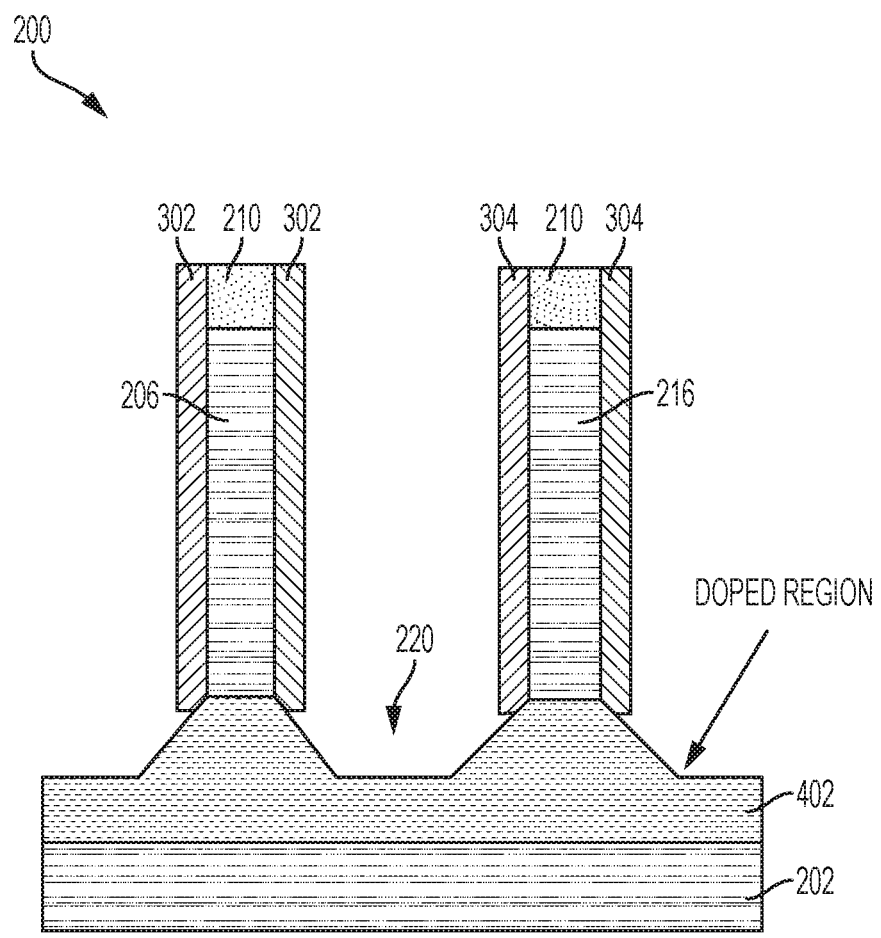
FIG. 4 depicts a diagram of semiconductor structure after intermediate fabrication stages according to one or more embodiments.

In FIG. 4, the lower base regions 208, 218 and the upper portion of the substrate 202 have been doped to form doped regions that will function as the bottom source/drain regions 402. The dopants may be implanted using an ion implantation and annealing process that implants dopants into the lower base regions 208, 218 and the upper portion of the substrate 202. The ion implantation process implants ions in the fins 302 and the annealing process drives or evaporates the ions through the lower base regions 208, 218 and the upper portion of the substrate 202. Suitable annealing processes include laser annealing and RTA.

Figure 5:
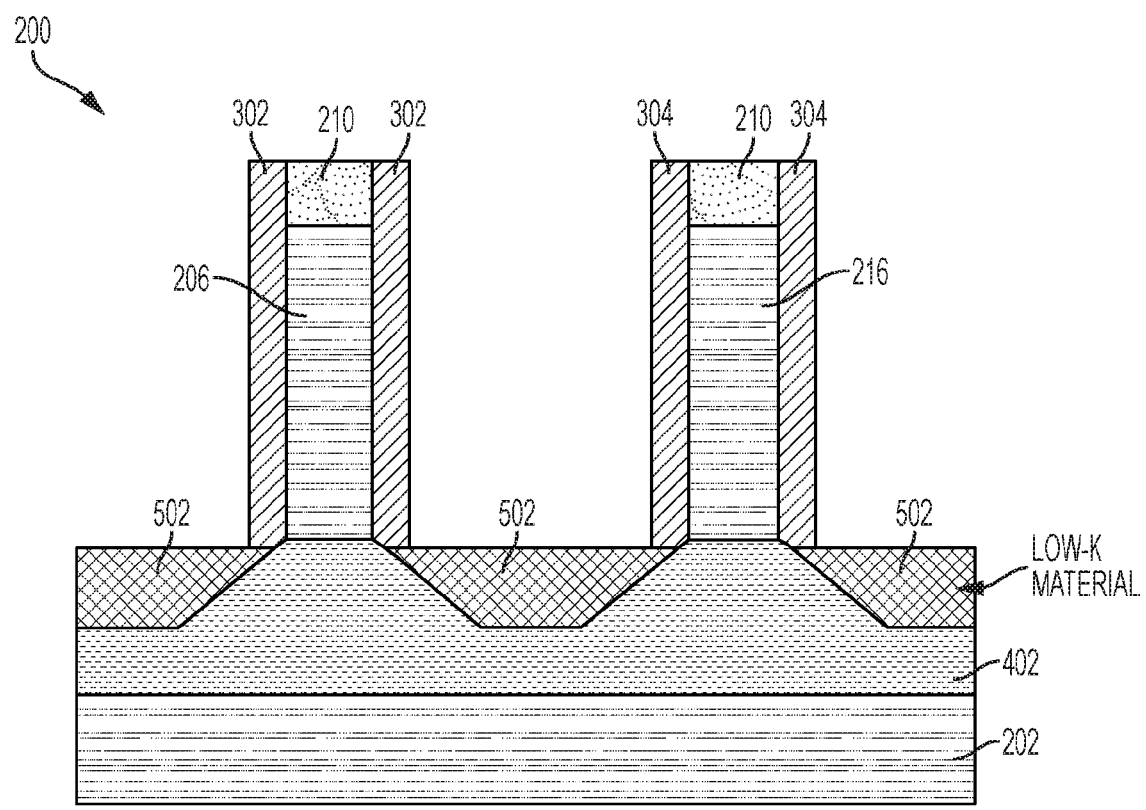
FIG. 5 depicts a diagram of semiconductor structure after intermediate fabrication stages according to one or more embodiments.

In FIG. 5, a low-k material (e.g., silicon dioxide) is deposited over the doped bottom source/drain regions 402, and then polished back to form dielectric regions 502 that substantially fill the trenches 202 (shown in FIGS. 2-4). For reasons described in more detail below, dielectric regions 502 are part of a structure that reduces capacitive coupling between the vertical gate structures 802, 804 (shown in FIG. 8) and the bottom source/drain region 402. In one or more embodiments, dielectric regions 502 are a low-k material(s). In the embodiments described herein, the lower the k value for dielectric regions 502, the less capacitive coupling between the vertical gate structures 802, 804 and the bottom source/drain region 402. Suitable low-k materials for dielectric regions 502 include silicon oxide and carbon/boron doped silicon nitride.

Figure 6:
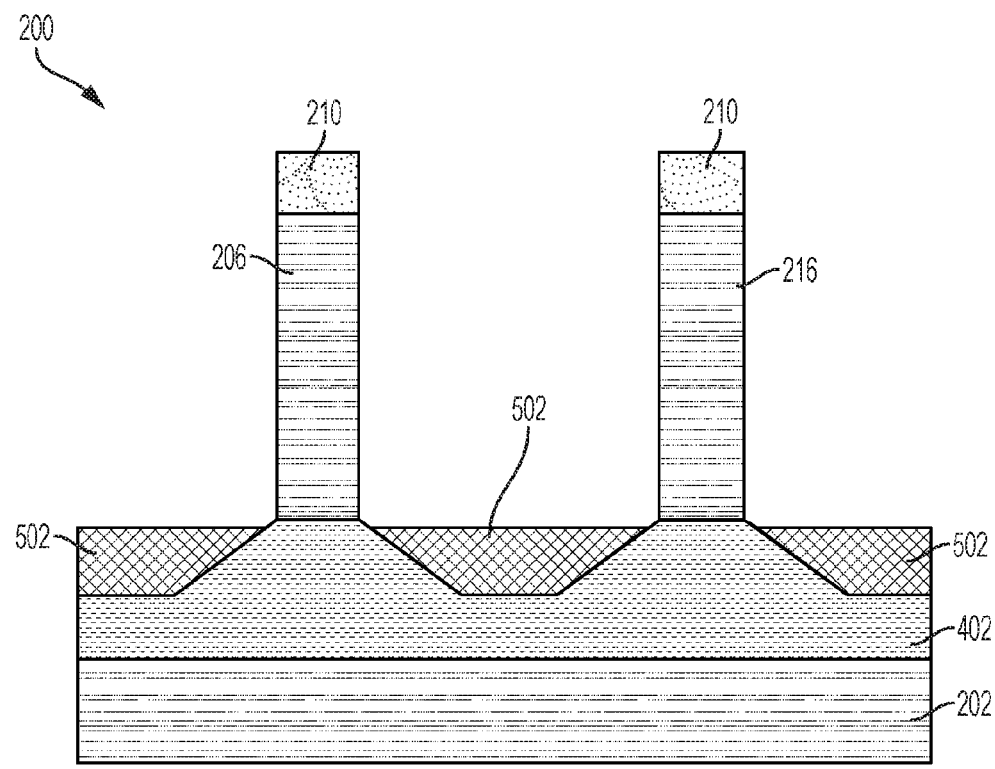
FIG. 6 depicts a diagram of semiconductor structure after intermediate fabrication stages according to one or more embodiments.
Figure 7:
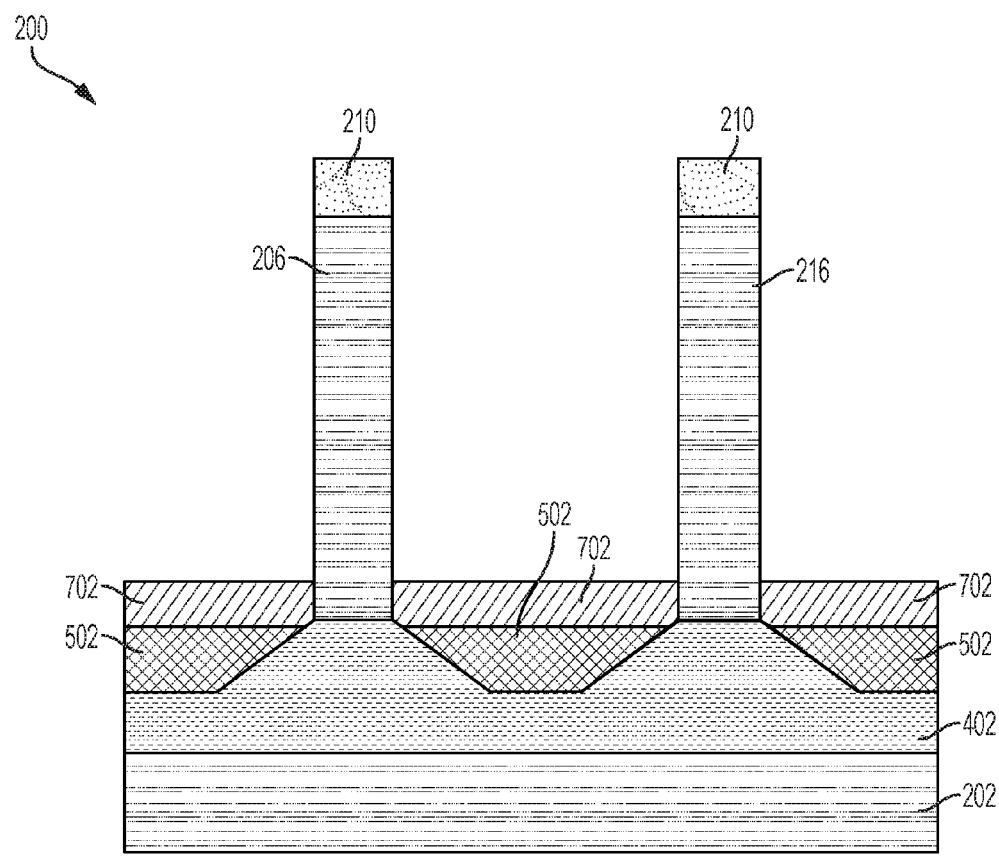
FIG. 7 depicts a diagram of semiconductor structure after intermediate fabrication stages according to one or more embodiments.

In FIG. 6, the sacrificial spacers 302, 304 are removed, and in FIG. 7, bottom spacers 702 are formed over the dielectric region 502. In one or more embodiments, the bottom spacers 702 are a high-k dielectric material such as silicon nitride.

In FIG. 8, a high-k layer 802 is formed along and around the sidewalls of upper fin regions 206, 216, and a work function metal 804 is formed along and around the sidewalls of upper fin regions 206, 216, as well as over the bottom spacer 702. As shown, and in accordance with embodiments of the present invention, the dielectric region 502 is positioned between the gate 804 and the bottom source/drain region 402, thereby increasing the distance between the gate 804 and the bottom source/drain region 402 and reducing the capacitive coupling between the gate 804 and the bottom source/drain region 402. The vertical height dimension of the dielectric region 502 is selected to bring any capacitive coupling between the gate 804 and the bottom source/drain 402 to within an acceptable range for the particular vertical FET design. As previously noted, the lower the k value for dielectric regions 502, the less capacitive coupling between the vertical gate structures 802, 804 and the bottom source/drain region 402. Suitable low-k materials for dielectric regions 502 include silicon oxide and carbon/boron doped silicon nitride. Accordingly, an acceptable level of capacitive coupling between the vertical gate structures 802, 804 and the bottom source/drain region 402 is provided by selecting design parameters that include the distance from the vertical gate structures 802, 804 to the bottom source/drain region 402, as well as the k-level of the low-k material that forms dielectric regions 502.

In FIG. 9, top spacers 902 are formed over the high-k layer 802 and the work function metal 804. In one or more embodiments, the top spacers 902 are a high-k dielectric material such as silicon nitride.

In FIG. 10, the hard masks 210 are removed, and doped upper source/drain regions 1002, 1004 are formed in the upper fin regions 206, 216. In one or more embodiments, the upper source/drain regions 1002, 1004 are formed by an epitaxial growth process that deposits a crystalline overlayer of semiconductor material onto the exposed crystalline seed material of the exposed silicon portions of the upper fin regions 206, 216. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 11:
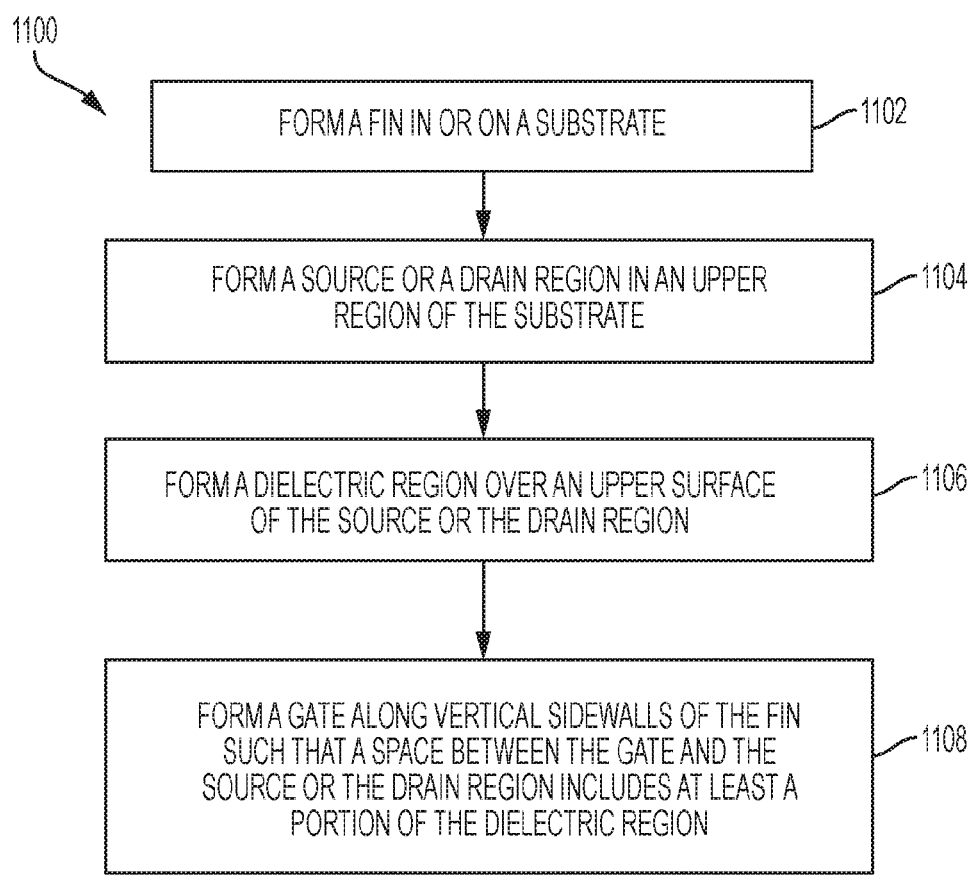
FIG. 11 depicts a flow diagram illustrating a methodology according to one or more embodiments.

FIG. 11 depicts a flow diagram illustrating a methodology 1100 according to one or more embodiments. Methodology 1100 begins at block 1102 by forming a fin in or on a substrate. In block 1104, a source or a drain region is formed in an upper region of the substrate. In block 1106, a dielectric region is formed over an upper surface of the source or the drain region. In block 1108, a gate is formed along vertical sidewalls of the fin such that a space between the gate and the source or the drain region includes at least a portion of the dielectric region. In one or more embodiments, block 1106 is implemented by forming a trench in the source or the drain region, and then forming the dielectric region in the trench. In one or more embodiments, the trench is formed by forming the fin to include an upper fin region and a lower base region, wherein the lower base region includes an upper surface and a base width dimension that is greater than the width of the upper fin region. In one or more embodiments, the upper surface of the lower base region is formed at an angle with respect to a major surface of the substrate. In one or more embodiments, the angle is greater than zero degrees and less than ninety degrees.

Thus, it can be seen from the foregoing detailed description and accompanying illustrations that one or more embodiments of the present invention provide improved fabrication methodologies and resulting structures for vertical FETs that reduce the impact of unwanted capacitance due to gate/source/drain overlap. In one or more embodiments, a portion of the bottom source/drain region that is below the vertical FET gate is replaced with a dielectric region. Thus, the dielectric region is positioned between the vertical gate and the bottom source/drain region, thereby increasing the distance between the vertical gate and the bottom source/drain region and reducing the capacitive coupling between the vertical FET gate and the bottom source/drain region. The vertical height dimension of the dielectric region is selected to bring any capacitive coupling between the vertical FET gate and the source/drain to within an acceptable range for the particular vertical FET design.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method of forming gate and source or drain features of a vertical field effect transistor (FET), the method comprising:
    forming a fin in a substrate;
    forming a source or a drain region in the substrate;
    forming a trench in the source or the drain region;
    forming a dielectric region in the trench;
    forming a gate along vertical sidewalls of the fin such that a space between the gate and the source or the drain region comprises at least a portion of the dielectric region; and
    forming a bottom spacer over an upper surface of the dielectric region such that the space between the gate and the source or the drain region further comprises at least a portion of the bottom spacer.

2. The method of claim 1, wherein the fin comprises an upper fin region and a lower base region.

3. The method of claim 2, wherein the lower base region includes an upper surface and a base width dimension.

4. The method of claim 3, wherein the upper fin region includes an upper fin width dimension.

5. The method of claim 4, wherein the base width dimension is greater than the upper fin width dimension.

6. The method of claim 5, wherein the dielectric region comprises a low-k material and the bottom spacer comprises a high-k material.

7. The method of claim 1, wherein forming the trench comprises:
    forming the fin to include an upper fin region and a lower base region, wherein the lower base region includes an upper surface, the lower base region includes a base width dimension, the upper fin region includes an upper fin width dimension, the base width dimension is greater than the upper fin width dimension, and at least a portion of the trench comprises an upper surface of the lower base region.

8. The method of claim 7, wherein the dielectric region comprises a low-k material and the spacer comprises a high-k material.

9. The method of claim 7, wherein at least a portion of the source or the drain region is formed from the lower base region.

10. The method of claim 9, wherein the upper surface of the lower base region is formed at an angle with respect to a major surface of the substrate.

11. The method of claim 10, wherein the angle comprises greater than zero degrees and less than ninety degrees.

* * * * *